(12) United States Patent
Patterson et al.

(10) Patent No.: US 8,361,828 B1
(45) Date of Patent: Jan. 29, 2013

(54) ALIGNED FRONTSIDE BACKSIDE LASER DICING OF SEMICONDUCTOR FILMS

(75) Inventors: Daniel G. Patterson, Morgan Hill, CA (US); Laila Mattos, Palo Alto, CA (US); Gang He, Cupertino, CA (US)

(73) Assignee: Alta Devices, Inc., Santa Clara, CA (US)

( * ) Notice: Subject to any disclaimer, the term of this patent is extended or adjusted under 35 U.S.C. 154(b) by 0 days.

(21) Appl. No.: 13/222,750

(22) Filed: Aug. 31, 2011

(51) Int. Cl.
*H01L 21/78* (2006.01)

(52) U.S. Cl. ...... 438/57; 438/68; 438/462; 257/E21.599

(58) Field of Classification Search ............... 438/57, 438/68; 219/121.72; 257/E21.599
See application file for complete search history.

(56) References Cited

U.S. PATENT DOCUMENTS

| | | | |
|---|---|---|---|
| 6,586,707 B2 * | 7/2003 | Boyle et al. | 219/121.69 |
| 6,781,093 B2 * | 8/2004 | Conlon et al. | 219/121.72 |
| 6,841,482 B2 * | 1/2005 | Boyle | 438/708 |
| 6,849,524 B2 | 2/2005 | Shelton et al. | |
| 6,887,804 B2 * | 5/2005 | Sun et al. | 438/130 |
| 7,545,843 B2 * | 6/2009 | Armani et al. | 372/92 |
| 7,772,090 B2 | 8/2010 | Starkston et al. | |
| 7,776,720 B2 * | 8/2010 | Boyle et al. | 438/463 |
| 7,804,043 B2 | 9/2010 | Deshi | |
| 2002/0086137 A1 | 7/2002 | Brouillette et al. | |
| 2004/0112880 A1 * | 6/2004 | Sekiya | 219/121.69 |
| 2005/0087522 A1 * | 4/2005 | Sun et al. | 219/121.71 |
| 2006/0068581 A1 * | 3/2006 | Kobayashi | 438/622 |
| 2006/0126677 A1 * | 6/2006 | Sun et al. | 372/30 |
| 2007/0272666 A1 * | 11/2007 | O'Brien et al. | 219/121.69 |
| 2007/0272668 A1 | 11/2007 | Albelo et al. | |
| 2008/0070378 A1 | 3/2008 | Yeo | |
| 2008/0220590 A1 | 9/2008 | Miller et al. | |
| 2009/0017600 A1 * | 1/2009 | Kirihara et al. | 438/462 |
| 2009/0191690 A1 * | 7/2009 | Boyle et al. | 438/462 |
| 2010/0009550 A1 * | 1/2010 | Tsujikawa et al. | 438/798 |
| 2010/0099238 A1 | 4/2010 | Vakanas et al. | |
| 2010/0213367 A1 * | 8/2010 | Miller | 250/282 |
| 2010/0219509 A1 | 9/2010 | He et al. | |
| 2010/0279490 A1 | 11/2010 | Starkston et al. | |
| 2010/0294347 A1 * | 11/2010 | Zimmer et al. | 136/252 |
| 2011/0030758 A1 * | 2/2011 | Kiriyama | 136/244 |
| 2011/0177674 A1 * | 7/2011 | Rodin et al. | 438/460 |
| 2011/0287607 A1 * | 11/2011 | Osako et al. | 438/462 |

* cited by examiner

*Primary Examiner* — Savitr Mulpuri
(74) *Attorney, Agent, or Firm* — Thomas Schneck; Mark Protsik

(57) ABSTRACT

A method and system for dicing semiconductor devices from semiconductor thin films. A semiconductor film, backed by a metal layer, is bonded by an adhesive layer to a flexible translucent substrate. Reference features define device boundaries. An ultraviolet laser beam is aligned to the reference features and cuts through the semiconductor film, the metal layer and partially into the adhesive layer, cutting a frontside street along a real or imaginary scribe line on the cutting path. An infrared laser beam is aligned to the trough of the frontside street from the back surface of the flexible substrate, or the scribe lines are mapped to the back surface of the flexible substrate. The infrared laser beam cuts through the flexible substrate and the majority of the thickness of the adhesive layer, cutting a backside street along the scribe line. The backside street overlaps or cuts through to the frontside street, thereby separating the semiconductor devices.

10 Claims, 5 Drawing Sheets

ALIGNED FRONTSIDE BACKSIDE LASER DICING OF SEMICONDUCTOR FILMS

TECHNICAL FIELD

The field of the present invention relates to semiconductor substrate dicing by laser radiation.

BACKGROUND

Traditional methods or systems for scribing, cutting and separating semiconductor devices from a semiconductor wafer, i.e. dicing, rely on cutting a street defined by a scribe line, using a diamond saw or a laser. In throughcutting, a single pass is made using the diamond saw or laser, cutting all the way through the wafer. In another technique, known as wafer fracturing, die separation is performed by cutting along a street partially through the thickness of the wafer, then cracking the wafer along the street and separating the dice. A scribe line can be expressed or delineated physically on the wafer, using scribe line geometries that are photolithographically deposited using one or more layers on the wafer, such as by using photoresist and etching. A scribe line can be physically delineated on the wafer by laser ablation of the wafer surface. Alternatively, a scribe line can be defined on the wafer in the abstract, for example using data in a computer memory, as a path along which a street is to be cut where only a reference feature on the wafer is needed. Whether or not a scribe line is physically delineated on a wafer, the scribe line can be expressed as a set of coordinates relative to a reference feature on the wafer.

Mechanical cutting of semiconductor wafers can cause cracks, splitting, damage to PN junctions and other effects on the wafers and devices being fabricated on the wafers. The width of the street and the corresponding amount of material removed represents wasted area of the wafer. It is desired to minimize the width of the street and minimize the wasted area of the wafer, thereby minimizing the cost per die produced.

Laser cutting generally produces a narrower street than diamond saw cutting. However, local heating from laser cutting can damage PN junctions. Combining a semiconductor wafer with one or more additional materials poses additional challenges to laser cutting or mechanical cutting.

Standard silicon wafers are nominally 275 microns to 775 microns thick, although additional sizes have been and are being developed. Thin wafers are nominally 100 microns to 150 microns thick. Ultrathin wafers can support thin films of nanometer or monolayer thicknesses and be up to several microns thick. Thin wafers or ultrathin wafers may need additional support during fabrication and handling, which poses challenges to laser cutting or mechanical cutting.

Solar cells, also known as photovoltaic cells, can be made from silicon wafers or from thin films, such as gallium arsenide films, among other materials. Epitaxial lift-off (ELO) films can be grown on wafers, then transferred to support surfaces. U.S. published application 2010/0219509 entitled "Tiled Substrates for Deposition and Epitaxial Lift Off Processes" by G. He and A. Hegedus, assigned to the assignee of the present invention and incorporated by reference herein, shows epitaxially grown film stacks transferred to a support substrate in a tiling pattern with gaps or streets between each of the ELO film stacks. An extensive list of support substrate materials is contained in the aforementioned published application.

SUMMARY

A method and a system for dicing semiconductor films is described, particularly where a support substrate is used. The substrate, preferably a polymer sheet is much thicker than the semiconductor film. The method and system apply frontside laser cutting and backside laser cutting that are aligned.

The first method is for dicing devices from a thin film semiconductor arrangement on a support substrate. The thin film is backed by a metal layer. The metal layer has a back surface bonded to a front surface of a translucent support substrate by an adhesive layer. The thin film has semiconductor devices in a desired areawise configuration thereupon with devices to be cut to a desired areawise size. The thin film has a front surface with scribe lines or streets or at least two reference marks defining device boundaries. The substrate has an exposed back surface.

An ultraviolet laser beam is directed to cut from the front surface of the semiconductor film. The ultraviolet laser beam cuts through the semiconductor film, through the metal layer and partially into any adhesive layer. A majority of a thickness of the adhesive layer remains intact.

The semiconductor film and the ultraviolet laser beam are moved relative to each other, to cut along one of the reference features, such as scribe lines, from the front surface of the semiconductor film. The cutting forms a first trough along the reference feature scribe line.

The scribe lines are mapped from the front surface of the wafer to corresponding mapped scribe lines on the back surface of the substrate. One method of mapping is by machine vision.

An infrared laser beam is directed to cut by ablation or melting from the back surface of the substrate. The infrared laser beam cuts from the back surface of the substrate through the substrate and through the majority of the thickness of the adhesive layer.

The semiconductor substrate and the infrared laser beam are moved relative to each other, to cut along one of the mapped scribe lines from the back surface of the substrate. The cutting forms a second trough along the mapped scribe line. The second trough meets or overlaps the first trough, thereby separating one of the semiconductor devices from another of the semiconductor devices.

In the case of dicing solar cells from a semiconductor film or a very thin film or wafer, the wafer is backed by a metal layer and is laminated to a translucent substrate. An adhesive layer bonds the substrate to the metal layer backing the wafer.

An ultraviolet laser beam is aligned to a reference feature scribe line defined on the front surface of the wafer. A frontside street is cut along the scribe line, using the ultraviolet laser beam. The ultraviolet laser beam cuts from the front surface of the wafer through the wafer, through the metal layer and partially into the adhesive layer. A trough of the frontside street is visible from the back surface of the substrate through the substrate and through the adhesive layer.

An infrared laser beam is aligned to the trough of the frontside street, from the back surface of the translucent substrate. A backside street is cut along the scribe line, using the infrared laser beam. The infrared laser beam cuts from the back surface of the substrate through the substrate and through a majority of the thickness of the adhesive layer. A trough of the backside street meets or overlaps the trough of the frontside street, thereby dicing the semiconductor film or wafer and substrate and separating one of the solar cells from another of the solar cells.

A system is described, for dicing solar cells from a semiconductor film having a plurality of solar cells. The system includes an imaging camera, an ultraviolet laser beam, an infrared laser beam, and a controller means.

The ultraviolet laser beam is configured to cut by ablation from a front surface of a thin film or wafer. The film has a metal layer backing, an optional adhesive layer backing the metal layer and a flexible translucent substrate backing the adhesive layer. The ultraviolet laser beam is configured to cut through the film or wafer, through the metal layer, and partially into the adhesive layer in forming a frontside street. The translucent substrate and a majority of the thickness of the adhesive layer remain intact.

The infrared laser beam is configured to cut from a back surface of the substrate. The infrared laser beam is configured to cut through the substrate and through the majority of the thickness of the adhesive layer, in forming a backside street.

A controller means cooperates with the imaging camera and the ultraviolet and infrared laser beams. The frontside street is cut, using the ultraviolet laser beam. From the back surface of the substrate, a portion of the frontside street is imaged. The portion of the frontside street being imaged is visible through the substrate and through the majority of the thickness of the adhesive layer. The infrared laser beam is aligned to the frontside street from the back surface of the flexible substrate. Aligning the infrared laser beam is based upon the imaging from the back surface of the substrate. The backside street is cut, using the aligned infrared laser beam. The backside street cuts through to the frontside street. The film may have semiconductor devices that are diced, or optoelectronic devices, photovoltaic devices or solar cells.

DETAILED DESCRIPTION

Figure 1:
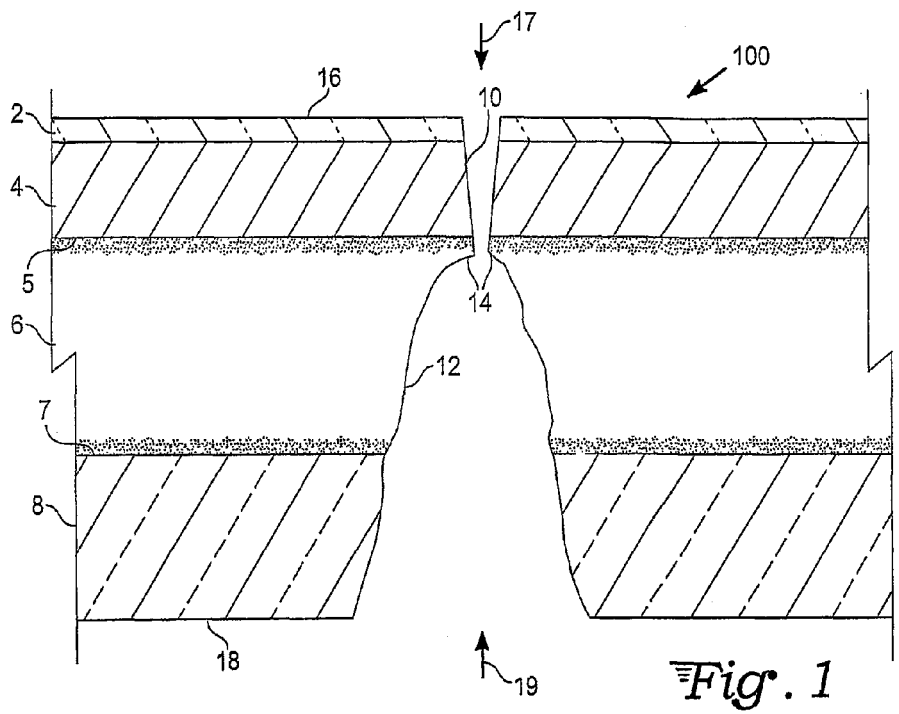
FIG. 1 is a cross-sectional view of a laser cut through a semiconductor thin film or wafer backed by a metal layer that is bonded to a flexible translucent substrate by an optional adhesive layer, in accordance with the present invention.

With reference to FIG. 1, an ultrathin gallium arsenide film 2 of about two microns thickness is cut by laser, so that semiconductor devices on the semiconductor film 2 are diced and separated. The semiconductor devices could be electronic chips, opto-electronic devices or solar chips. In this example, the semiconductor devices are solar cells. The aligned frontside backside laser cut 100 is performed using two differing lasers, one of which makes the frontside cut 10 to form the frontside street, the other of which makes the backside cut 12 to form the backside street. The two cuts and the two streets overlap, separating the semiconductor devices.

The film 2 is backed by a metal layer 4. All references to semiconductor films apply to ELO semiconductor films fabricated as solar cells. In this example, the metal layer 4 contacts the P type semiconductor material, and forms the positive terminal of the solar cell. Metal traces, shown in FIG. 2 on the front surface 16 of the film 2 contact the N type semiconductor material and form the negative terminal of the solar cell.

Returning to FIG. 1, the back surface 5 of the metal layer 4 is bonded to the front surface 7 of a translucent substrate 8 by an adhesive layer 6. In this example, the translucent substrate 8 is a sheet of PET (polyethylene terephthalate), a polymer material that is moderately flexible and quite dissimilar from the material of the semiconductor film. PET material is not thermally conductive, while the semiconductor film is moderately thermally conductive. PET is a thermoplastic polymer resin of the polyester family, and is in known use as a flexible substrate for thin films, thin and ultrathin wafers. Translucent is herein defined to include translucent or transparent materials. The flexible translucent substrate 8 provides support for the ultrathin gallium arsenide film 2 with metal layer 4 backing. In one example, after the solar cells are separated from the film 2, each solar cell retains a respective portion of the flexible substrate 8 with corresponding portion of the adhesive layer 6, and is mounted in a solar panel. In a further example, testing, handling and/or further processing can occur after a first laser cut and prior to a second laser cut, with the flexible substrate intact. The second laser cut can be performed at a later time, severing the flexible substrate.

Example thicknesses for the stacked layers are two microns for the gallium arsenide film 2, twenty microns of copper for the metal layer 4, fifty microns for the adhesive layer 6 and fifty microns of PET for the flexible substrate 8.

Differing laser beams are used to perform two cuts 10 and 12. A first laser beam, aimed in a direction 17 towards the front surface 16 of the film 2, makes a first cut as a frontside cut 10 from the front surface 16 of the film 2. A second laser beam, aimed in a direction 19 towards the back surface 18 of the flexible substrate 8, makes a second cut as a backside cut 12 from the back surface 18 of the flexible substrate 8. The lasers are selected and tuned for their abilities to cut through the respective layers and materials. Ultraviolet (UV) is a suitable wavelength for laser cutting of metals, but tends to pass through translucent and transparent materials. Infrared (IR) is a suitable wavelength for laser cutting of polymers, of which PET is a member, and adhesives, but tends to reflect off of metal.

An ultraviolet laser provides a corresponding ultraviolet laser beam as the first laser beam. The ultraviolet laser beam cuts through the film 2, through the metal layer 4, and partially into the adhesive layer 6. A suitable wavelength for the ultraviolet laser is 355 nanometers, which has been successfully tested using the disclosed method for cutting through solar film layers with pulse widths in the nanosecond range and in the picosecond range. Cuts along a scribe line, which will be discussed with reference to FIG. 2, can be accomplished using a single-pass or a multi-pass process.

An infrared laser provides a corresponding infrared laser beam as the second laser beam. The infrared laser beam cuts through the flexible substrate 8 and through the majority of the adhesive layer 6, until a trough of the frontside cut 10 meets or overlaps with a trough of the backside cut 12 or equivalently the backside cut 12 cuts through to the frontside cut 10. The depth of the second cut, i.e. the backside cut 12, is controlled so that the second cut just meets the first cut i.e. the frontside cut 10. A 10600 nm (nanometer or nanometers) continuous wave and a 9400 nm pulsed carbon dioxide laser have each been successfully tested using the disclosed method in performing the backside cut 12.

With the combination of the frontside cut 10 and the backside cut 12 completely cutting through all of the layers of the stacked materials, the solar cells, ICs or other semiconductor devices fabricated on the film 2 become diced and can be separated mechanically from each other and from the wafer. A small amount of the thickness of the adhesive layer 6 remains in place in an overhang 14, providing mechanical support for the corresponding portion of the metal layer 4 and film 2. The portion of the adhesive layer 6 remaining in the overhang 14 further protects the back surface 5 of the metal layer 4 from oxidation or other corrosion.

Each of the laser beams, namely the ultraviolet laser beam and the infrared laser beam, is adjusted to control the depth and width of the respective cut, by testing and calibration. As shown in FIG. 1, the beams can be adjusted so that the ultraviolet laser beam produces a narrower frontside cut 10 than the backside cut 12 produced by the infrared laser beam. Laser beam spot size, wavelength, intensity and pulse duration can be selected and tuned to produce the indicated cut in the respective materials. In this manner, the amount of material removed from the semiconductor film or wafer 2 is minimized. The wider backside cut 12 produced by the infrared laser beam, in comparison with the width of the frontside cut 10 produced by the ultraviolet laser beam, results in a greater tolerance of alignment error and greater likelihood of successful alignment of the backside cut 12 with the frontside cut 10 as compared to a backside cut 12 of equal width to the frontside cut 10.

Use of two, differing laser beams each optimized for cutting the respective materials reduces the total processing time for laser cutting and improves throughput as compared to a single laser beam process. As compared to a mechanical cutting process which can impart mechanical stresses and cause distortion or displacement to the solar film, the use of the two laser beams provides improved positioning accuracy and eliminates cracks associated with mechanical sawing and separation. Laser power for both lasers is about 5 watts average power.

With the boundary of a solar cell defined by the laser cuts, the active area of the solar cell is maximized as compared to mechanical cutting and attendant loss of active area. The process of laser cutting along a scribe line can be performed with or without the use of photolithographically deposited or laser defined scribe line geometries, as will be described.

Figure 2:
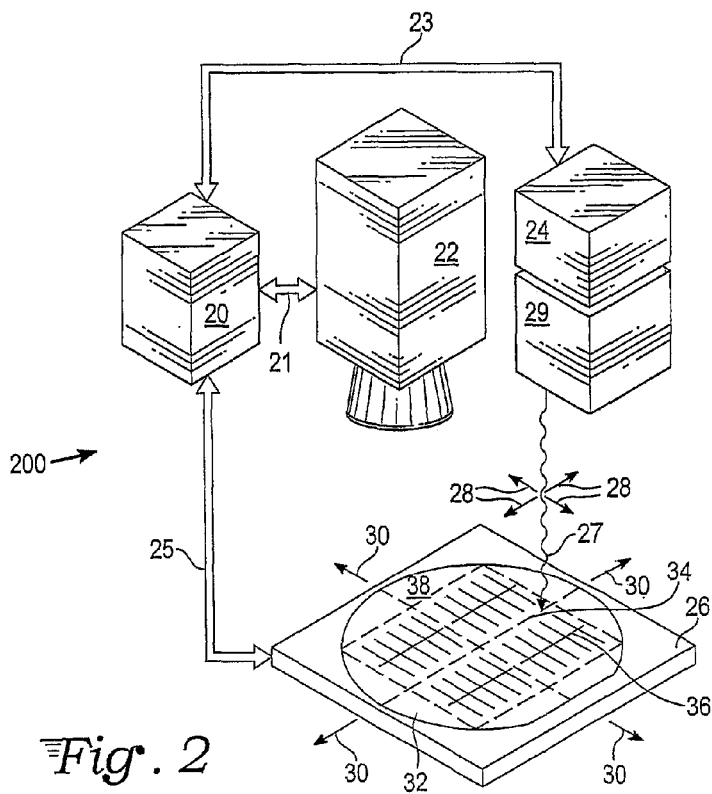
FIG. 2 is a perspective view of a laser cutting system performing a frontside cut, in a step of performing the laser cut of FIG. 1.

With reference to FIG. 2, a laser cutting system 200 is shown performing the frontside cut 10 as seen in FIG. 1. A controller 20 has a bidirectional communication path 21 to an imaging camera 22, and a bidirectional communication path 23 to an ultraviolet laser 24 and beam steering device 29. An ultraviolet laser beam 27, produced by the ultraviolet laser 24 and steered by the beam steering device 29, cuts along a scribe line 34 defined on the film 32. The cut is performed from the front surface 38 of the film 32. The ultraviolet laser beam 27 and the film 32 are moved relative to each other, by moving the ultraviolet laser beam 27 in various directions 28 and/or by moving the film 32 in various directions 30. In one embodiment, the ultraviolet laser beam 27 is moved by beam steering optics as will be discussed with reference to FIG. 6, i.e. the beam steering device 29 includes beam steering optics, and the stage 26 is stationary. In a further embodiment, the beam steering device 29 includes a set of actuators that move the ultraviolet laser 24, thereby moving the ultraviolet laser beam 27. In a still further embodiment, the film 32 is moved by a movable stage 26 controlled by the controller 20 over a bidirectional communication path 25, and the ultraviolet laser beam 27 is stationary. In further embodiments, both the stage 26 and the ultraviolet laser beam 27 are movable. In variations, one or more of the communication paths is unidirectional.

Various techniques can be used to align the ultraviolet laser beam 27 to the film 32 for cutting a frontside street along the scribe line 34 from a front surface 38 of the film 32. Alignment can be performed before a laser beam is switched on, such as by positioning a laser, positioning a film, positioning a movable stage holding the film, or preparing data that will direct a laser beam or a movable stage.

In a first frontside alignment technique, the imaging camera 22 captures or forms an image of the exposed front surface 38 of the film 32, including metal traces 36 on the front surface 38 of the film 32. The metal traces 36 are, in this example, the buss bars of the negative terminal of the solar cell, and are in electrical contact with the N type material of the large PN diode junction that forms the solar cell. In further examples, the metal traces can be top layer metal interconnect on an integrated circuit or other previously deposited metal pattern on the front surface of the solar cell, die or film. In further examples, geometries other than metal traces could be used for image capturing.

A cutting path is defined as a scribe line 34 on the film. The scribe line can be shown or highlighted, i.e. physically represented, by photolithographically deposited or laser ablated scribe line geometries using known processes. Alternatively, the scribe line can be a virtual line defined by two reference points. Although a wafer is described, a thin semiconductor film, such as an ELO film, can be processed in the same manner. In other words, a scribe line is defined in the abstract e.g. as a set of coordinates relative to the wafer as determined using machine vision.

Using machine vision, the controller 20 cooperates with the imaging camera 22 and produces a first data set in computer memory representing the image of the front surface 38 of the film 32. Various machine vision operations may be performed, such as imaging under various lighting conditions, x-ray, infrared or other types of imaging, 2-D or 3-D imaging, image processing, signal processing, grayscale or color intensity manipulation, edge enhancement, edge extraction, feature extraction, pattern matching, pattern recognition, orientation determination, linking, mapping, generation or determination of data sets, reference points, coordinates and so on. At least a first reference point relative to the image of the front surface 38 of the film 32 is determined, such as a starting point or an ending point for cutting the frontside street along the scribe line 34, an intersection of two scribe lines or frontside streets, a location along one of the metal traces 36 on the film 32.

In preparation for cutting the frontside street, the controller 20 links the scribe line 34 to the first reference point and may link to further reference points. The controller 20 prepares data for guiding the ultraviolet laser beam 27 from the ultraviolet laser 24, based upon the linking of the scribe line 34 to the first reference point. In this manner, the ultraviolet laser beam 27 is aligned to the film 32 from the front surface 38 of the wafer 32 and is aligned to the scribe line 34 from the front surface 38 of the wafer 32.

In variations of the first frontside alignment technique, the ultraviolet laser beam 27 is aligned to the scribe line 34 from the front surface 38 of the film 32 by recognizing the metal traces 36, photolithographically deposited scribe line geometries or alignment targets, or other feature or features imaged and processed by machine vision.

In further variations of alignment techniques, machine vision is not used, and alignment is done by manual positioning, optically assisted positioning and/or dead reckoning from coordinates obtained when the film was at another location or from coordinates based upon similar films or a test fixture. Such variations of the system may trade off cost, speed and accuracy, by omitting the imaging camera 22.

Figure 3:
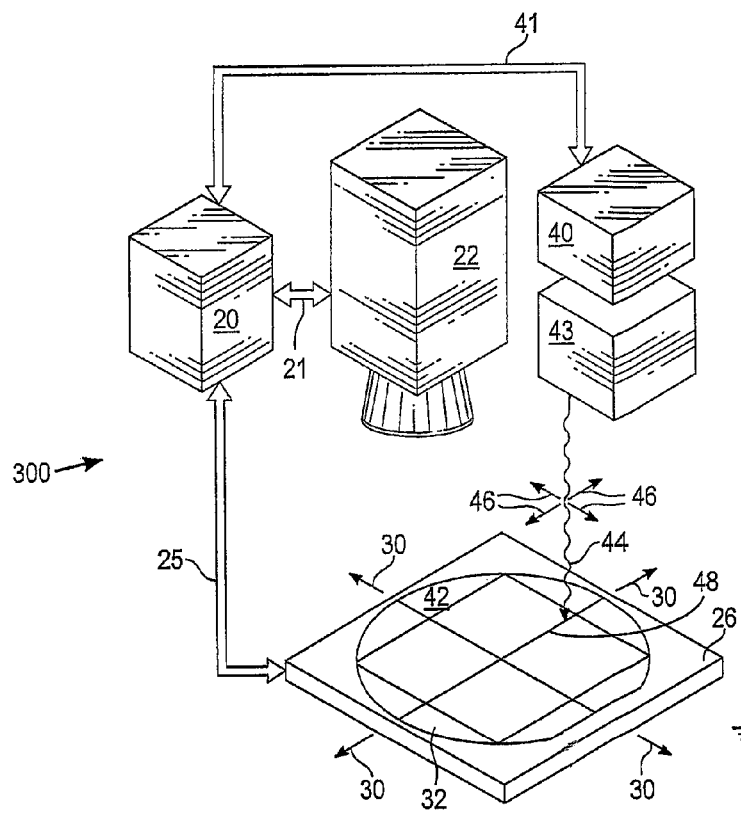
FIG. 3 is a perspective view of a laser cutting system performing a backside cut, in a step of performing the laser cut of FIG. 1.

With reference to FIG. 3, a laser cutting system 300 is shown performing the backside cut 12 as seen in FIG. 1. The laser cutting system 300 can reuse or integrate portions or the entirety of the laser cutting system 200, or in variations can substitute alternative components for one or more of the components of the laser cutting system 200. In a further variation, the laser cutting system 300 occupies a separate workstation or workspace from the laser cutting system 200.

Recall that a scribe line 34 is defined on the film 32, and is used in cutting the frontside street. The scribe line 34 can be represented in a data set e.g. as coordinates relative to the wafer 32. In some embodiments, the scribe line 34 is represented physically on a wafer 32 as by photolithographically deposited scribe line geometries. Similarly, a scribe line 48 is defined on the film 32, and is used in cutting the backside street. The scribe line 48 is mapped from the scribe line 34, as by mapping from the front surface 38 of the film 32 to the back surface 42 of the flexible substrate. The scribe line 48 can be represented in a data set e.g. as coordinates relative to the film 32. Conceptually, the scribe line 48 can be thought of as "the same" as the scribe line 34, with the difference being that the scribe line 34 is used for cutting the frontside street and the scribe line 48 is used for cutting the backside street. The mapping is used for coordinating data sets relative to the front surface 38 of the film 32 and the back surface 42 of the flexible substrate, and for operating the laser cutting system or systems. With this mapping, the scribe line 48 aligns with the scribe line 34, so that the respective streets and cuts align. With the backside street aligning to the frontside street, the backside cut 12 and the frontside cut 10 can overlap all along the scribe line 34, thereby severing one semiconductor device from another semiconductor device.

In the laser cutting system 300, a controller 20 has a bidirectional communication path 21 to an imaging camera 22, and a bidirectional communication path 41 to an infrared laser 40 and beam steering device 43. An infrared laser beam 44, produced by the infrared laser 40 and steered by the beam steering device 43, cuts along a scribe line 48 defined on the film 32. The cut is performed from the back surface 42 of the flexible substrate, through which the film 32 is visible in this example as a result of the flexible substrate and the adhesive layer being translucent. The infrared laser beam 44 and the film 32 are moved relative to each other, by moving the infrared laser beam 44 in various directions 46 and/or by moving the wafer 32 in various directions 30. In one embodiment, the infrared laser beam 44 is moved by beam steering optics as will be discussed with reference to FIG. 6, i.e. the beam steering device 43 includes beam steering optics, and the stage 26 is stationary. In a further embodiment, the beam steering device 43 includes a set of actuators that move the infrared laser 40, thereby moving the infrared laser beam 44. In a still further embodiment, the wafer 32 is moved by a movable stage 26 controlled by the controller 20 over a bidirectional communication path 25. In further embodiments, both the wafer 32 and the infrared laser beam 44 are movable. In variations, one or more of the communication paths is unidirectional.

Various techniques can be used to align the infrared laser beam 44 to the film 32 for cutting a backside street along the scribe line 48 from a back surface 42 of the flexible substrate. In a first backside alignment technique, the imaging camera 22 captures or forms an image of the exposed back surface 42 of the flexible substrate. The image of the back surface 42 of the flexible substrate includes imaging of the trough or portion of the frontside street that is visible from the back surface 42 of the flexible substrate through the flexible substrate and through the adhesive layer.

The scribe line 48, as used in cutting the backside street, is in this example shown, highlighted or physically represented by the trough or portion of the frontside street visible from the back surface 42 of the flexible substrate as a result of the flexible substrate and the adhesive layer being translucent. In this manner, the trough or portion of the frontside street visible from the back surface 42 of the flexible substrate performs a physical and optically visible mapping of the scribe line 34 from the front surface of the wafer 32 to the back surface 42 of the flexible substrate.

Using machine vision, the controller 20 cooperates with the imaging camera 22 and produces a second data set relative to the image of the back surface 42 of the flexible substrate and the trough of the frontside street that is visible therethrough. Reference points relative to the image of the back surface 42 of the substrate are determined, such as a starting point and an ending point for cutting the backside street along the scribe line 48, or an intersection of scribe lines or backside streets.

In preparation for cutting the backside street, the controller 20 links the scribe line 48 to the second reference point and may link to further reference points. The controller 20 prepares data for guiding the infrared laser beam 44 based upon the linking of the scribe line 48 to the second reference point. In this manner, the infrared laser beam 44 is aligned to the film 32 from the back surface 42 of the substrate, is aligned to the scribe line 48 from the back surface 42 of the substrate, is aligned to the scribe line 30 as used in cutting the frontside street, and is aligned to the trough of the frontside street that is visible through the back surface 42 of the flexible substrate.

Figure 4:
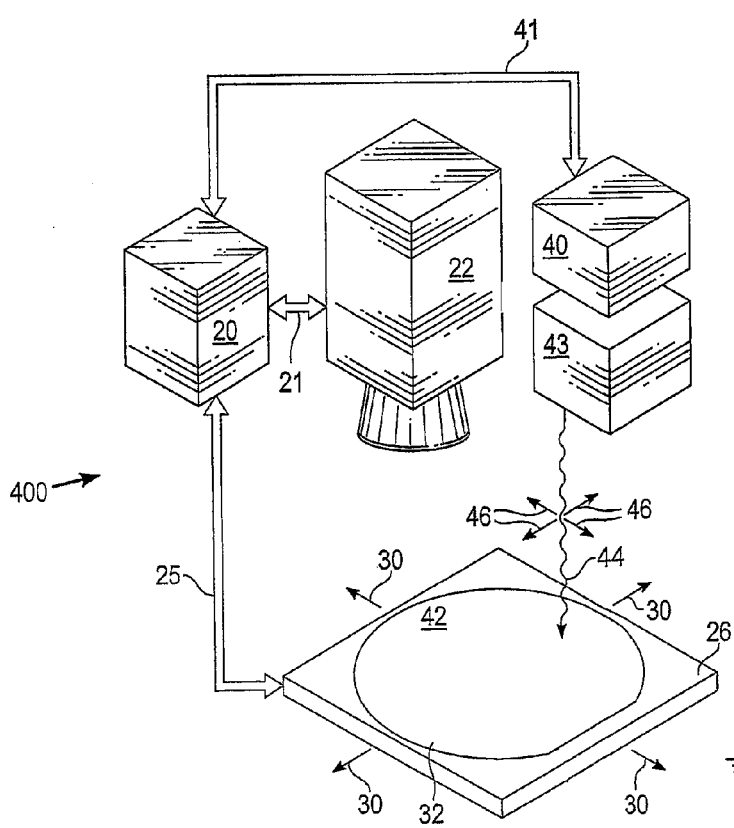
FIG. 4 is a perspective view of an alternative laser cutting system performing a backside cut, in a variation of a step of performing the laser cut of FIG. 2.

With reference to FIG. 4, a laser cutting system 400 is shown implementing a second backside alignment technique as a variation of the first backside alignment technique. In this example, the trough of the frontside street is not visible through the back surface 42 of the flexible substrate, as a result of the presence of an opaque material, lighting conditions, imaging equipment constraints or other reason. Alternatively, the laser cutting system 400 can be used even if the trough of the frontside street is visible through the back surface 42 of the flexible substrate. The imaging camera 22 captures an image of the back surface 42 of the flexible substrate. The infrared laser beam 44 is aligned from the back surface 42 of the flexible substrate to the scribe line 34 as used in cutting the frontside street, by mapping the scribe line 34 to the back surface 42 of the flexible substrate using machine vision. The scribe line 48, as used in cutting the backside street, is a mapped scribe line as mapped from the scribe line 34. Reference points are determined relative to the image of the back surface 42 of the flexible substrate. The scribe line 48, as mapped from scribe line 34, is linked to the second reference point. The controller 20 prepares data for guiding the infrared laser beam 44 based upon the linking of the mapped scribe line 48 to the second reference point. In this manner, the infrared laser beam 44 is aligned to the wafer 32 from the back surface 42 of the flexible substrate, and is aligned from the back surface 42 of the substrate to the mapped scribe line 48.

Figure 5:
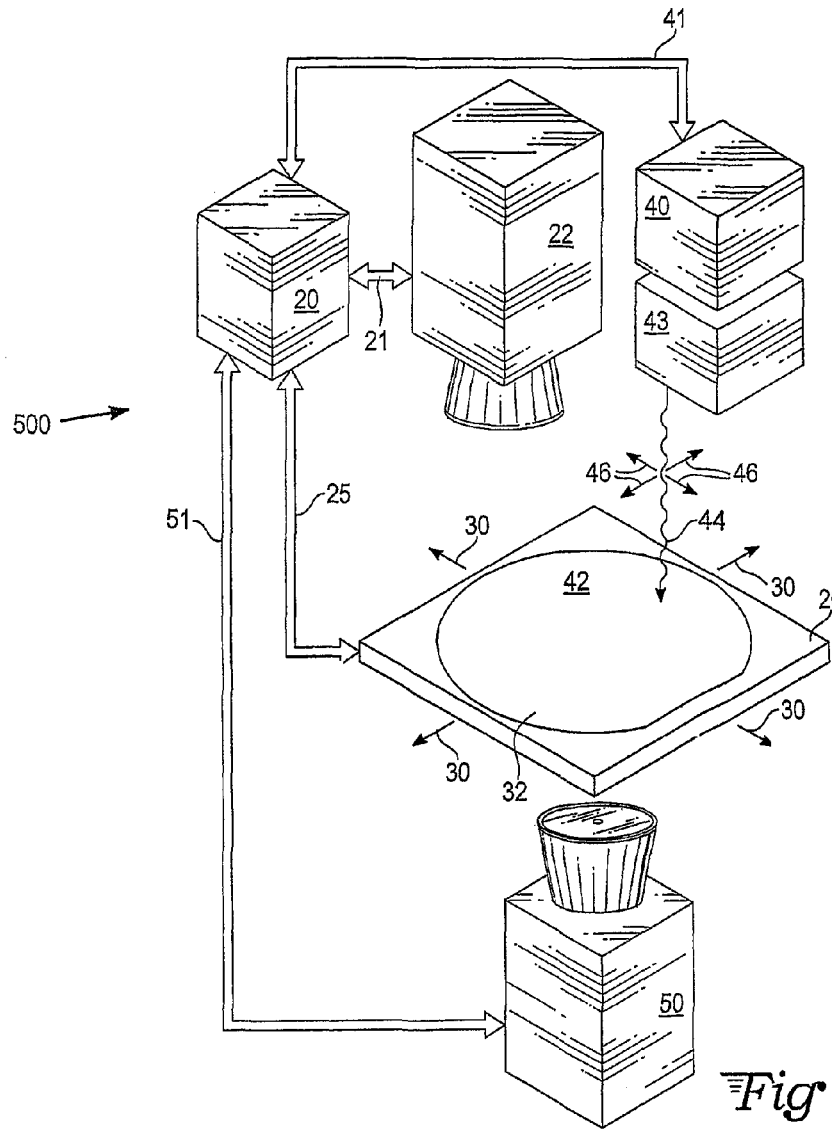
FIG. 5 is a perspective view of a still further laser cutting system performing a backside cut, in a further variation of a step of performing the laser cut of FIG. 2.

With reference to FIG. 5, a laser cutting system 500 is shown implementing a third backside alignment technique as a variation of the first or second backside alignment techniques. In this example, the trough of the frontside street is not visible through the back surface 42 of the flexible substrate, although the laser cutting system 500 can be used if the frontside street is visible through the back surface 42 of the substrate. An imaging camera 50 images the front surface of the wafer 32, through the stage 26 that is supporting the wafer 32. The stage 26 can be transparent or have a transparent window or an opening through which the front surface of the wafer 32 is visible to the imaging camera 50. In a variation, the front surface of the wafer 32 is facing upward and the imaging camera 50 is mounted above the wafer 32, while the infrared laser 40 is mounted below the wafer 32. In a still further variation, the film is oriented vertically rather than horizontally and held by one or more edges in a holder. In a further embodiment, the laser cutting system 500 is equipped with both an infrared laser and an ultraviolet laser and performs both the frontside and backside cuts. The ultraviolet laser can be positioned facing the front surface of the substrate.

The controller 20, cooperating and communicating with the imaging camera 50 over a bidirectional communication path 51, uses machine vision and produces a data set relative to the image of the front surface 38 of the wafer 32. At least two reference points relative to the image of the front surface 38 of the film 32 are determined, such as points along the frontside street, intersections of scribe lines or frontside streets, or locations along one of the metal traces on the film 32.

In preparation for cutting the backside street, the controller 20 links the scribe line 48, as mapped from the scribe line 34, to the reference point and may link to further reference points. The controller 20 prepares data for guiding the infrared laser beam 44 based upon the linking of the scribe line 48 to the first reference point. The infrared laser 40 and the imaging camera 50 are calibrated relative to each other or relative to a shared coordinate system or grid, so that the infrared laser 40 can be operated and the infrared laser beam 44 guided by the controller 20 using data from the imaging camera 50. In a variation, a further imaging camera 22, connected to the controller 20 by a bidirectional communication path 21, is used to verify, determine or arrange positioning of the film 32.

With reference to FIGS. 2-5, the laser cutting systems 200, 300, 400, 500 have variations with fixed or movable stages 26, other types of holders, horizontal, vertical or angled mountings of the wafer 32 and further arrangements of imaging cameras, lasers and controllers. The controller can include multiple controller units, integrated or distributed processing and controlling, hardware, software, firmware and combinations thereof. The frontside and backside cuts can be performed by separate systems or by one integrated system.

Figure 6:
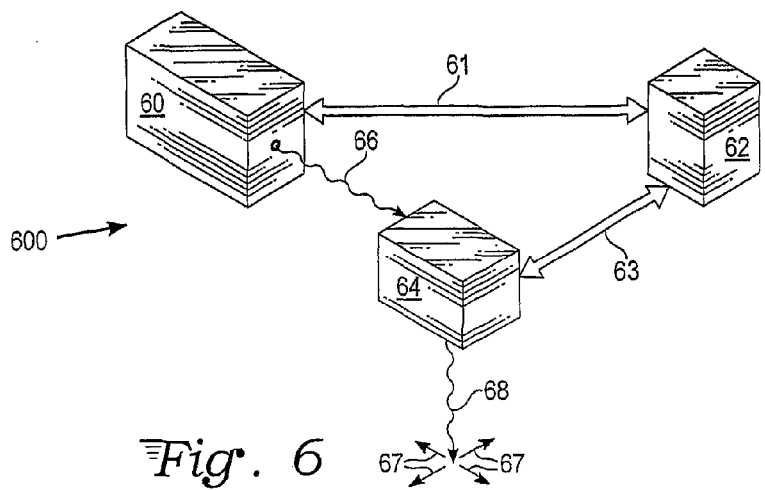
FIG. 6 is a perspective view of a laser scanner with beam steering optics, as used in a variation of the laser cutting systems of FIGS. 2-5.

With reference to FIG. 6, a two dimensional laser scanner 600 is shown. The two-dimensional laser scanner 600 can be used for moving a laser beam, such as in any of the laser cutting systems 200, 300, 400, 500 or variations thereof. A controller 62 cooperates with a laser 60 over a bidirectional communication path 61 and cooperates with a beam steering optics unit 64 over a bidirectional communication path 63. A laser beam 66 from the laser 60 enters the beam steering optics unit 64, and a movable laser beam 68 exits the beam steering optics unit 64. The movable laser beam 68 can be moved in various directions 67, as directed by the controller 62.

The contents of the beam steering optics unit 64 can include a rotating mirrored drum, one or more steerable mirrors, one or more steerable lenses, and motors, galvanometric or other actuators as appropriate, or other known mechanisms for steering a laser beam, and various combinations. Examples of such steerable mirrors include a first mirror that tilts along a first axis to control a reflected laser beam in an X direction, followed by a second mirror that tilts along a second axis to control a reflected laser beam in a Y direction, the assembly thus controlling a laser beam in X and Y directions. Examples of mirrored drums include octagonal and other polygonal cross-section drums with mirrored faces, with the drums spinning to scan a laser beam in a linear manner. The laser beam can be scanned orthogonally to the scan produced by the rotating mirrored drum, by using an orthogonally positioned further rotating mirrored drum or a steerable mirror. One or more passive reflecting mirrors can be incorporated to fold, redirect or otherwise rearrange a beam path. The laser 60 can be switched on and off by the controller 62. In a variation, the beam steering optics unit 64 has a shutter or deflecting mirror (not shown, but readily devised) that can switch the movable laser beam 68 on and off. Various embodiments of the laser 60 and the beam steering optics unit 64 can be used in the laser cutting systems 200, 300, 400, 500 as the respective laser and beam steering device therein, with the controller 62 communicating with or integrated with the controller of such a system.

Figure 7A:
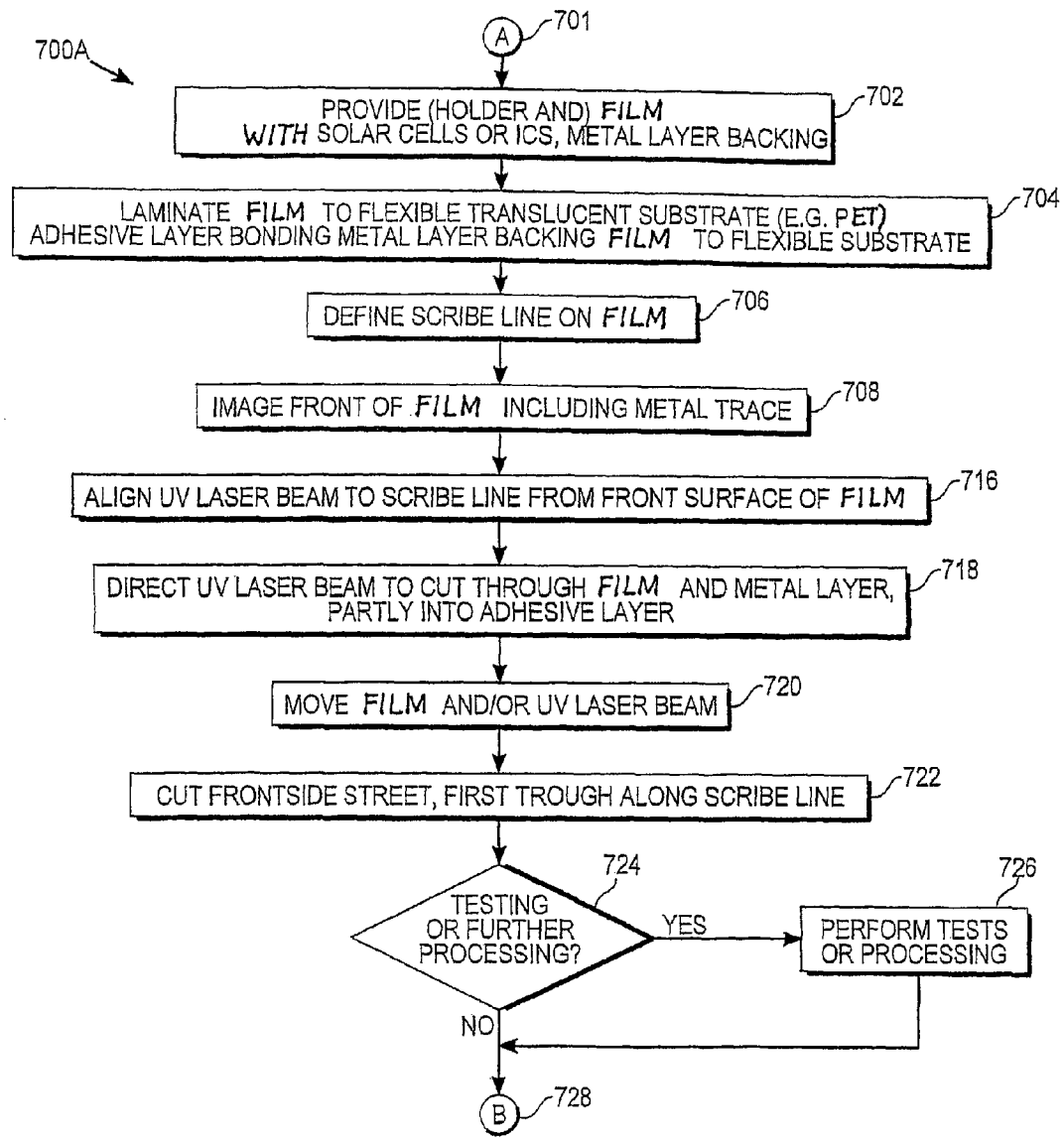
FIGS. 7A and 7B are a flow diagram of a method of performing a laser cut as shown on the semiconductor film or wafer in FIG. 1. The method is usable with the laser cutting systems of FIGS. 2-5.
Figure 7B:
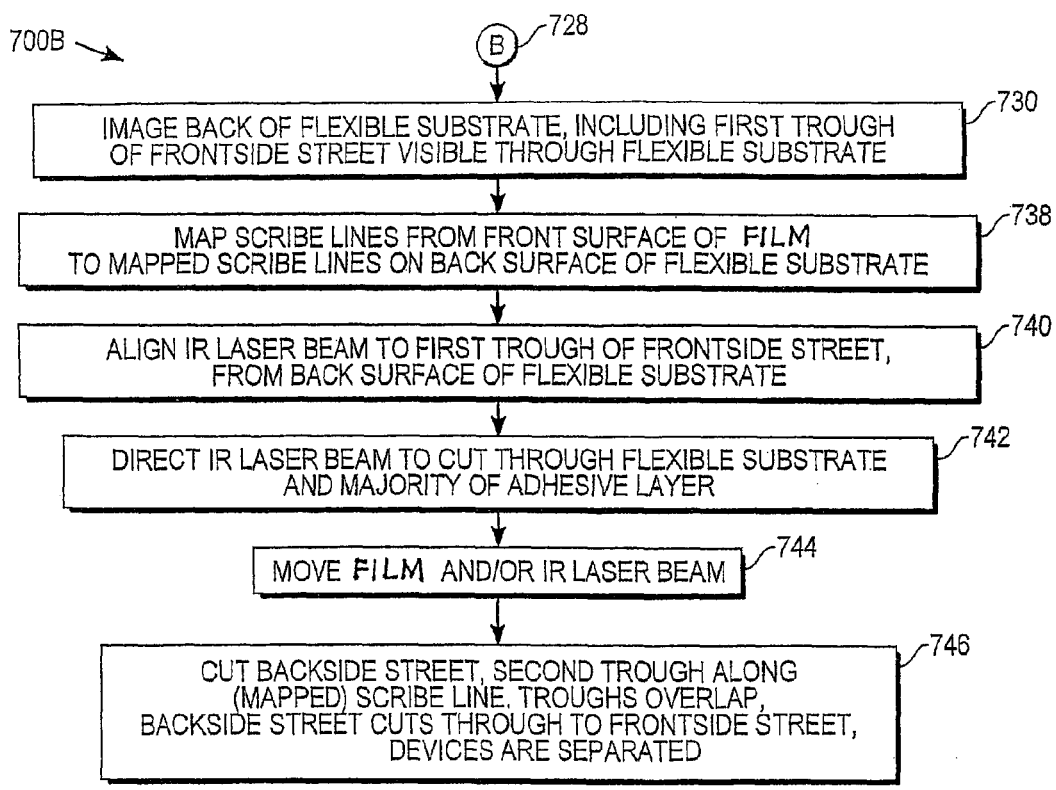

With reference to FIGS. 7A and 7B, a method 700A and 700B of performing a frontside backside laser cut on a semiconductor wafer is shown, as can be practiced using the laser cutting systems 200, 300, 400, 500 and variations thereof. The method 700A corresponds to the frontside laser cut and the method 700B corresponds to the backside laser cut. Variations of the method use some of the steps, combine some of the steps or change the sequences of some of the steps.

With reference to FIG. 7A, the method 700A for performing the frontside laser cut starts at entry point "A" 701 and has blocks as shown. In a block 702, a semiconductor film is provided, and a holder is provided. The film has solar cells or integrated circuits (ICs) and has a metal layer backing layer. In a block 704, the film is laminated to a flexible translucent substrate, for example PET. The lamination has an adhesive layer bonding the metal layer, backing the film, to the flexible substrate. In a block 706, reference points are determined and a scribe line real or virtual, is defined on the film. In a block 708, the front of the film is imaged, including a metal trace. In a block 716, a UV laser beam is aligned to the scribe line, from the front surface of the film. In a block 718, the UV laser beam is directed to cut through the film and the metal layer and partly into the adhesive layer. In a block 720, the film and/or the UV laser beam is moved. In a block 722, the frontside street, including the first trough, is cut along the scribe line. In a block 724, a decision is made as to whether testing or further processing will be done. If there is to be testing or further processing as decided in the block 724, then in a block 726 one or more tests or processing is performed. After the testing or processing, the method proceeds to entry point "B" 728 of method 700B. If there is not to be testing or further processing, the method proceeds directly to entry point "B" 728 of method 700B.

With reference to FIG. 7B, the method 700B for performing the backside laser cut starts at entry point "B" 728 and has blocks as shown. In a block 730, the back of the flexible substrate is imaged, including the first trough of the frontside street that is visible through the flexible substrate. In a block 738, scribe lines are mapped from the front surface of the wafer to mapped scribe lines on the back surface of the flexible substrate. In a block 740, an IR laser beam is aligned to the first trough of the frontside street, from the back surface of the flexible substrate. In a block 742, the IR laser beam is directed to cut through the flexible substrate and through the majority of the adhesive layer. In a block 744, the film and/or the IR laser beam is moved. In a block 746, the backside street and included second trough are cut along the (mapped) scribe line. The troughs overlap. The backside street cuts through to the frontside street, and semiconductor devices are separated. While an ultraviolet laser has been described as having the preferred wavelength for cutting a semiconductor film, the other wavelengths may be used including suitable visible wavelengths, particularly green. Instead of an infrared laser, another wavelength in the visible spectrum, difference from the first laser may be used and selected by matching absorption by the substrate.

What is claimed is:

1. A method for dicing semiconductor devices, comprising:
    providing a holder supporting a semiconductor film backed by a metal layer having a back surface bonded to a front surface of a substrate by an adhesive layer, the film having semiconductor devices thereupon and having an exposed front surface with reference features defining real or virtual device boundaries, and the flexible substrate having an exposed back surface;
    directing an ultraviolet laser beam of a first wavelength to cut from the front surface of the film through the semiconductor film, through the metal layer and partially into the adhesive layer such that a majority of a thickness of the adhesive layer remains intact;
    moving the semiconductor film and the ultraviolet laser beam relative to each other to cut using the device boundaries from the front surface of the film to form a first trough;
    mapping the real or virtual device boundaries from the front surface of the semiconductor film to corresponding mapped real or virtual device boundaries on the back surface of the flexible substrate;
    directing an infrared laser beam of a second wavelength to cut from the back surface of the flexible substrate through the flexible substrate and through the majority of the thickness of the adhesive layer; and
    moving the semiconductor film and the infrared laser beam relative to each other to cut using the mapped device boundaries from the back surface of the flexible substrate and form a second trough using the mapped device boundaries meeting or overlapping the first trough thereby separating a one of the semiconductor devices from another of the semiconductor devices.

2. The method of claim 1 wherein the semiconductor devices are electronic chips, opto-electronic devices or solar cells.

3. The method of claim 1 further comprising:
    using machine vision to create an image of the front surface of the wafer and data relating thereto; and
    determining at least two reference points on the image of the front surface of the wafer, wherein the scribe line as applied to forming the first trough is at least partially based upon the two reference points.

4. The method of claim 1 further comprising:
    using machine vision to create an image of the back surface of the flexible substrate and a portion of the first trough visible therethrough, and data relating thereto; and
    determining at least two reference points on the image of the front and back surface of the flexible substrate identifying device boundaries.

5. The method of claim 1 wherein testing or semiconductor processing is performed subsequent to the forming of the first trough and prior to the forming of the second trough.

6. A method for dicing solar cells from a semiconductor film, comprising:
    providing a semiconductor film that has a plurality of solar cells thereupon and is backed by a metal layer, the semiconductor film having a front surface;
    laminating the semiconductor film to a flexible and at least translucent substrate, using an adhesive layer to bond the substrate to the metal layer backing the semiconductor, the adhesive layer having a thickness and the substrate having a back surface;
    establishing reference features on the film;
    aligning an ultraviolet laser beam to a cutting path based upon the reference features from the front surface of the film;
    cutting a frontside street along the cutting path, using the aligned ultraviolet laser beam to cut from the front surface of the film through the film, through the metal layer and partially into the adhesive layer, a trough of the frontside street being visible from the back surface of the substrate through the substrate and through the adhesive layer;
    aligning an infrared laser beam to the trough of the frontside street from the back surface of the substrate; and
    cutting a backside street, using the aligned infrared laser beam to cut from the back surface of the flexible substrate through the substrate and through a majority of the thickness of the adhesive layer so that a trough of the backside street meets or overlaps the trough of the frontside street, thereby dicing the semiconductor film and substrate and separating a one of the solar cells from another of the solar cells.

7. The method of claim 6 wherein the semiconductor film is a gallium arsenide ELO semiconductor film.

8. The method of claim 6 further comprising:
    using machine vision to produce an image of a pre-deposited metal trace on the front surface of the film;
    determining reference points on the image of the metal trace and the front surface of the film to define a backside cutting path.

9. The method of claim 6 further comprising imaging from the back surface of the substrate the trough of the frontside street that is visible through the substrate, wherein aligning the infrared laser beam is based upon the imaging of the trough of the frontside street from the back surface of the substrate.

10. The method of claim 6 further comprising testing one or more of the solar cells after cutting the frontside street, with the flexible substrate intact.

* * * * *